United States Patent [19]

Fujimura et al.

[11] Patent Number: 4,980,022
[45] Date of Patent: Dec. 25, 1990

[54] METHOD OF REMOVING A LAYER OF ORGANIC MATTER

[75] Inventors: Shuzo Fujimura, Tokyo; Kenichi Hikazutani, Kuwana, both of Japan

[73] Assignee: Fujitsu Limited, Kawasaki

[21] Appl. No.: 488,556

[22] Filed: Mar. 5, 1990

[30] Foreign Application Priority Data

Mar. 10, 1989 [JP] Japan ................................. 1-56053

[51] Int. Cl.$^5$ ...................... B44C 1/22; B29C 37/00; C03C 15/00; C03C 25/06
[52] U.S. Cl. ........................................ 156/643; 134/1; 156/646; 156/651; 156/655; 156/659.1; 156/668; 156/345; 204/192.36
[58] Field of Search ............... 156/643, 646, 651, 655, 156/659.1, 662, 668, 345; 134/1, 31; 204/192.32, 192.35, 192.36

[56] References Cited

U.S. PATENT DOCUMENTS

| | | | |
|---|---|---|---|
| 4,749,440 | 6/1988 | Blackwood et al. | 156/646 |
| 4,789,427 | 12/1988 | Fujimura et al. | 156/643 |
| 4,861,424 | 8/1989 | Fujimura et al. | 156/643 |
| 4,861,732 | 8/1989 | Fujimura et al. | 437/229 |

FOREIGN PATENT DOCUMENTS 63-216346 9/1988 Japan .
63-273321 11/1988 Japan .

OTHER PUBLICATIONS

"Ashing of Ion-Implanted Resist Layer", Fujimura et al., Japanese Journal of Applied Physics, vol. 28, No. 10, Oct., 1989, pp. 2130–2136.
"Ion Implantation Change in the Chemical Structure of a Resist", Fujimura et al., Nuclear Instruments and Methods in Physics Research, B39, (1989), pp. 809–812.

*Primary Examiner*—William A. Powell
*Attorney, Agent, or Firm*—Armstrong, Nikaido, Marmelstein, Kubovcik & Murray

[57] ABSTRACT

A method removes a first layer of an organic matter which is formed on a second layer, where the first layer is subjected to an ion implantation. The method includes the steps of generating a plasma by exciting a gas which includes $H_2O$ using a high-frequency energy source, and removing the first layer within the plasma.

11 Claims, 5 Drawing Sheets

METHOD OF REMOVING A LAYER OF ORGANIC MATTER

BACKGROUND OF THE INVENTION

The present invention generally relates to methods of removing layers of organic matters, and more particularly to a method of removing a layer of an organic matter such as a resist which is used as a mask during an ion implantation and is degraded by the ion implantation.

Ion implantation is used in production steps of a semiconductor device. When making the ion implantation, a layer of an organic matter is used as a mask, and a resist is generally used as the organic matter. Recently, some production steps make the ion implantation with a high dosage of $1 \times 10^{14}$ atoms/cm$^2$.

During the ion implantation, the resist is degraded and it is extremely difficult to completely remove the degraded resist by the normal O$_2$ plasma ashing. A large quantity of residue remains even after the O$_2$ plasma ashing, and a surface on which the residue exists must be slightly etched to completely remove the residue. As a result, the freedom with which the semiconductor device may be designed is limited by the need to carry out an etching after the O$_2$ plasma ashing.

On the other hand, the present inventors have proposed a method of removing the resist by a dry process using a plasma which is obtained by exciting a gas which includes hydrogen but includes no oxygen. According to the proposed method, however, the ashing rate is slow even when a 100% H$_2$ gas is used. For this reason, this proposed method is impractical for industrial applications. For example, the ashing rate is approximately 700 Å/min for a positive resist OFPR800 manufactured by Tokyo Ooka Kohgyo Kabushiki Kaisha of Japan when a reactive ion etching (RIE) is carried out using a H$_2$ gas with a flow rate of 300 cc/min, pressure of 0.5 Torr and an RF power of 300 W.

The H$_2$ gas is flammable and it is dangerous to use H$_2$ gas of a high density. But when the density of the H$_2$ gas is set to 3% or less which is below the explosive limits, the ashing rate with the above described conditions falls to under 100 Å/min.

Therefore, there is a demand for a method of completely removing the degraded resist at a high speed without danger.

SUMMARY OF THE INVENTION

Accordingly, it is a general object of the present invention to provide a novel and useful method of removing a layer of an organic matter, in which the problems described above are eliminated and the above described demand is satisfied.

Another and more specific object of the present invention is to provide a method of removing a first layer of an organic matter which is formed on a second layer, where the first layer being subjected to an ion implantation, comprising the steps of generating a plasma by exciting a gas which includes H$_2$O using a high-frequency energy source, and removing the first layer within the plasma. According to the method of the present invention, it is possible to completely remove the first layer which is degraded by the ion implantation. The removal of the first layer can be carried out at a high speed without damaging the second layer. Furthermore, the method is safe especially when compared to the method which uses a H$_2$ RIE, and the process can thus be carried out using an inexpensive equipment.

Other objects and further features of the present invention will be apparent from the following detailed description when read in conjunction with the accompanying drawings.

DESCRIPTION OF THE PREFERRED EMBODIMENTS

A description will be given of a first embodiment of a method of removing a layer of an organic matter according to the present invention. The positive resist OFPR800 referred above is formed on a silicon (Si) wafer to a thickness of approximately 1.1 μm and is baked for 2 minutes at 120° C. to form a sample. Arsenide ions (As$^+$) are injected into this sample with a dosage of $1 \times 10^{16}$ atoms/cm$^2$ and an energy of 70 keV. Then, the degraded resist is removed by three different processes, namely, an O$_2$ RIE, a H$_2$ RIE and a H$_2$O RIE.

Figure 1:
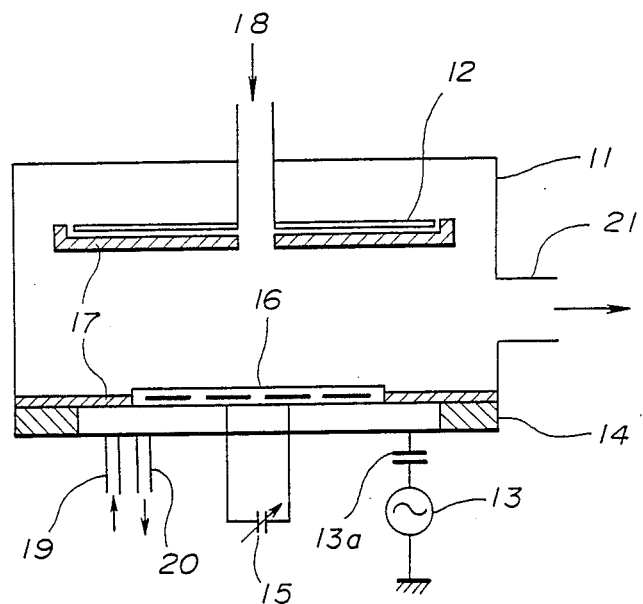
FIG. 1 is a side view in cross section generally showing an RIE apparatus which is used to carry out a method of removing a layer of an organic matter according to the present invention.

A parallel plate type RIE apparatus shown in FIG. 1 is used for the three different RIE processes. In FIG. 1, the RIE apparatus generally comprises a reaction chamber 11, an opposing electrode 12, an RF power source 13 of 13.56 Hz, an insulator 14, a D.C. power source of 2 to 3 kV, a quartz (SiO$_2$) 17, an etching gas introducing opening 18, an introducing opening 19 for cooling water and gas, an exhaust opening for the cooling water and gas, and an exhaust opening 21 for vacuum exhaust. A wafer 16 is positioned within the RIE apparatus as shown. The RIE apparatus shown in FIG. 1 is well known, and is different from an apparatus which generates an electron cycrotron resonance (ECR) plasma (electron cycrotron resonance plasma).

Figure 2:
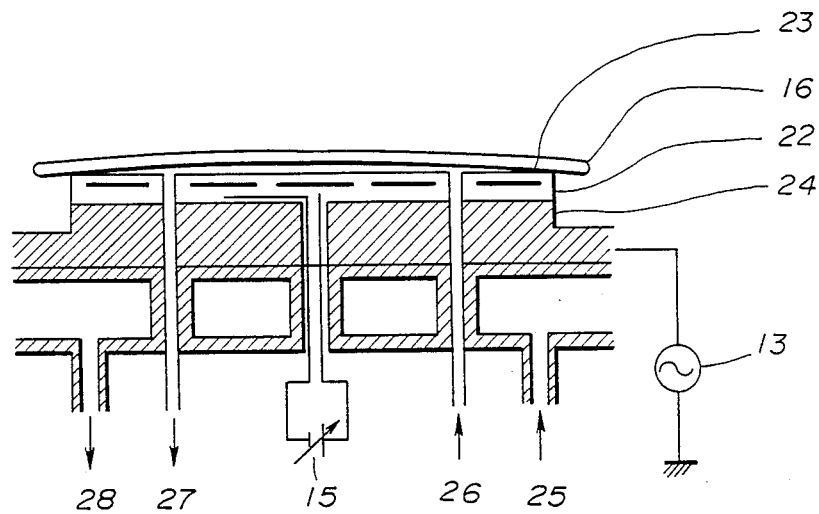
FIG. 2 is a side view in cross section generally showing a wafer holding and cooling mechanism of the RIE apparatus shown in FIG. 1.

FIG. 2 shows a wafer holding and cooling mechanism. In FIG. 2, the wafer holding and cooling mechanism generally comprises an insulator 22, an electrostatic chuck electrode 23, an RF electrode (cathode) 24, a cooling water entrance 25, a cooling gas entrance 26, an exhaust opening 27 for the gas, and a waste opening 28 for the water.

In the first embodiment, the O$_2$, H$_2$ and H$_2$O respectively have a flow rate of 300 cc/min, a pressure of 0.5 Torr and an RF power of 300 W. A stage temperature is 5° C., and the wafer temperature is maintained to 50° C. or less during each of the RIE processes.

The results of the RIE processes are confirmed by studying the wafer surface.

Figure 3A:
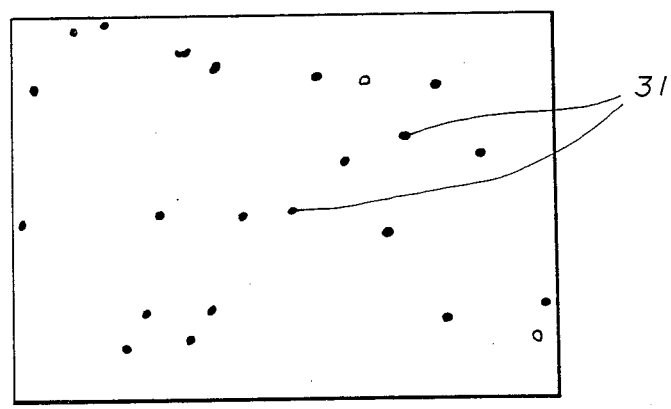
FIGS. 3A and 3B respectively are plan views showing residue after an O$_2$ RIE with magnifications of 750 and 10,000 times.
Figure 3B:
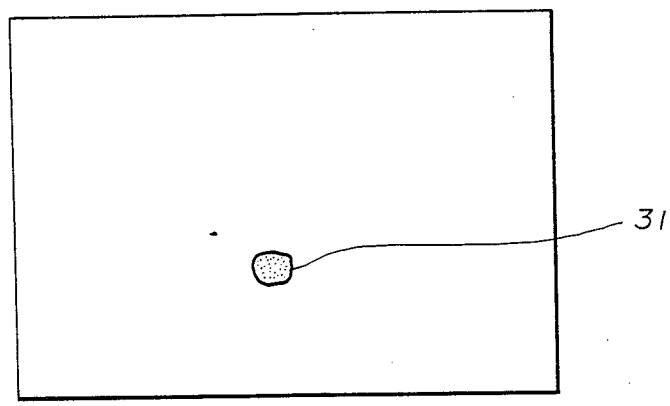

FIGS. 3A and 3B respectively show the residue on the wafer surface after the $O_2$ RIE with magnifications of 750 and 10,000 times. FIGS. 3A and 3B are based on photographs of the wafer surface. It can be seen from FIGS. 3A and 3B that a large quantity of residue 31 exists on the wafer surface.

On the other hand, no residue was found on the wafer surface after the $H_2$ RIE and the $H_2O$ RIE, even in the photographs of the wafer surface having the magnification of 10,000 times.

The time required to remove the residue on the wafer surface was 2 minutes and 40 seconds for the $O_2$ RIE, 15 minutes for the $H_2$ RIE and 3 minutes and 15 seconds for the $H_2O$ RIE. The over-ashing is 50 to 100 % for the $O_2$ RIE, and 20 to 30% for both the $H_2$ RIE and $H_2O$ RIE. Hence, it was confirmed that the $H_2O$ RIE is superior compared to the $O_2$ RIE and $H_2$ RIE when removing the residue on the wafer surface.

Therefore, it was confirmed that the $H_2O$ RIE is effective in removing by ashing the resist which is degraded by the ion implantation. When removing the resist which is used as a mask during the ion implantation, the thickness of the degraded resist layer is measured beforehand, and the $H_2O$ RIE is carried out for a time which is required to completely remove the degraded resist layer. After removing the degraded resist layer, the remaining resist layer which is not degraded may be removed by a known wet etching so as to minimize the damage to the wafer surface. Hereunder, the resist layer which is not degraded by the ion implantation will simply be referred to as a non-degraded resist. However, when the non-degraded resist layer is subjected to the ashing using a dry etching, the resist layer can be removed within a shorter time without the need for a wet etching. Hence, the present inventors conducted the experiments outlined in a second embodiment which is described hereunder.

In the second embodiment, the positive resist OFPR800 is formed on the Si wafer to a thickness of approximately 1.1 μm, and is baked for 2 minutes at 120° C. to form a sample. This sample is directly subjected to an ashing by three different processes, namely, an $O_2$ RIE, a $H_2$ RIE and a $H_2O$ RIE, so as to measure the ashing rate for each RIE. The stage temperature is 5° C. and the flow rate of the gas is 300 cc/min for each RIE. The following Table 1 shows the measured results.

TABLE 1

| Gas | Conditions | Ashing Rate |
|---|---|---|
| $O_2$ | 0.5 Torr, 300 W | 15610 Å/min |
|  | 1.0 Torr, 300 W | 9210 Å/min |
|  | 0.5 Torr, 500 W | 31000 Å/min |
|  | 1.0 Torr, 500 W | 24120 Å/min |
| $H_2$ | 0.5 Torr, 300 W | 702 Å/min |
|  | 0.5 Torr, 500 W | 1035 Å/min |
| $H_2O$ | 0.5 Torr, 300 W | 3045 Å/min |
|  | 1.0 Torr, 300 W | 1570 Å/min |
|  | 0.5 Torr, 500 W | 6240 Å/min |
|  | 1.0 Torr, 500 W | 6720 Å/min |

From Table 1, it can be seen that the $O_2$ RIE is extremely effective in removing the resist by the ashing when the resist is not much affected by the ion implantation. Accordingly, when the degraded resist is removed by the $H_2O$ RIE and the $O_2$ RIE is carried out thereafter to remove the non-degraded resist, the time required to completely remove the resist can be shortened further. On the other hand, because the $H_2O$ RIE is much more effective than the $H_2$ RIE, it is practical to remove both the degraded resist and the non-degraded resist by continuously carrying out the $H_2O$ RIE.

Next, a description will be given of a third embodiment. The present inventors conducted experiments on the removal of the non-degraded resist after the removal of the degraded resist. The same sample is used as in the first embodiment, and approximately 2000 Å of the degraded resist layer is removed by the RIE. The ashing time of this RIE is 30 seconds for the $O_2$ RIE, 3 minutes and 41 seconds for the $H_2$ RIE and 1 minute for the $H_2O$ RIE, where the pressure is 0.5 Torr and the RF power is 300 W for each RIE. Thereafter, the remaining non-degraded resist layer is removed by a downstream of $O_2+N_2$ (10% $N_2$) gas at a stage temperature of 150° C. As a result, no residue was found on the wafer surface after the $H_2$ RIE+($O_2+N_2$) downstream ashing, and no residue was found on the wafer surface after the $H_2O$ RIE+($O_2+N_2$) downstream ashing, even in the photographs of the wafer surface having the magnification of 10,000 times. Therefore, the practicality of the $H_2$ RIE+($O_2+N_2$) downstream ashing and the $H_2O$ RIE+($O_2+N_2$) downstream ashing was confirmed.

Figure 4A:
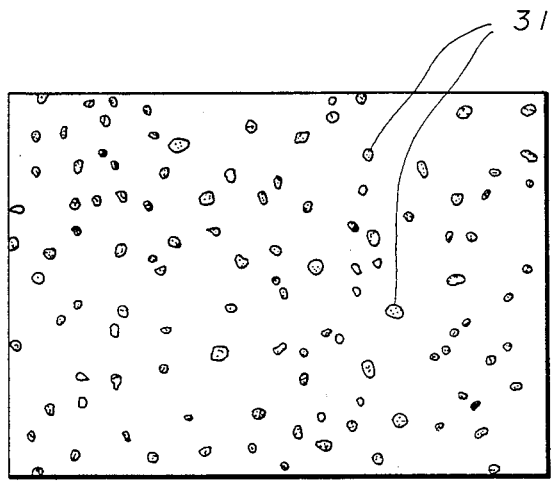
FIGS. 4A and 4B respectively are plan views showing a wafer surface after a downstream ashing which follows the O$_2$ RIE with magnifications of 750 and 10,000 times.
Figure 4B:

In the case of the $O_2$ RIE+($O_2+N_2$) downstream ashing, the residue 31 was found on the wafer surface as shown in FIGS. 4A and 4B which respectively show the wafer surface with magnifications of 750 and 10,000 times. FIGS. 4A and 4B are based on photographs of the wafer surface. It can be seen from FIG. 4B that a large quantity of the residue 31 exists on the wafer surface, and rough portions 32 are formed on the wafer surface. The rough portions 32 are formed when the wafer surface is scraped.

Therefore, although the ashing time of the $O_2$ RIE is shorter than that of the $H_2$ RIE, the residue 31 remains and the rough portions 32 are formed on the wafer surface even when the $O_2$ RIE is changed to the downstream ashing at a suitable time. On the other hand, the ashing time of the $H_2O$ RIE is considerably shorter than that of the $H_2$ RIE, and it was confirmed that no residue remains and there is no damage to the wafer surface after the $H_2O$ RIE.

Figure 5:
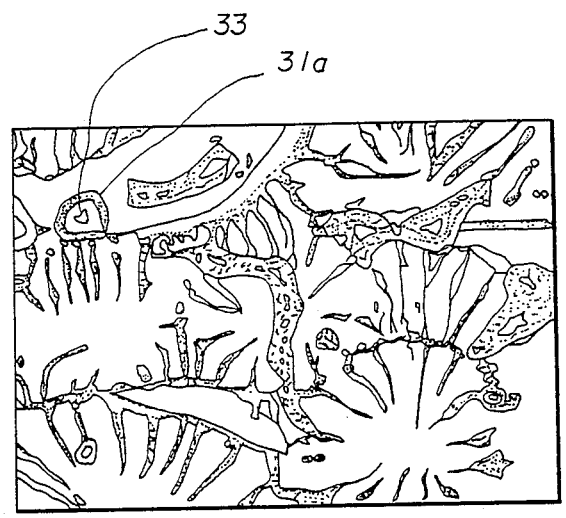
FIG. 5 is a plan view showing a wafer surface after the downstream ashing.
Figure 6:
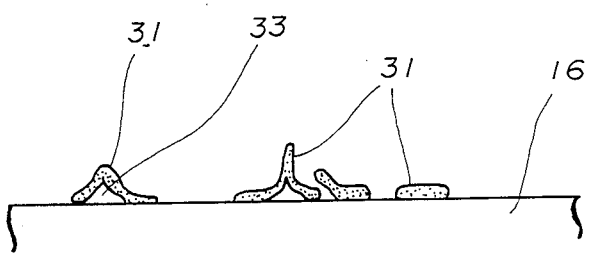
FIG. 6 is a cross sectional view showing residue on the wafer surface.

For the sake of comparison, the present inventors also carried out an experiment for the $O_2+N_2$ downstream ashing only. But in this case, the residue 31 remains on the wafer surface as shown in FIG. 5 which is based on a photograph of the wafer surface with a magnification of 750 times. In addition, it was confirmed that a non-degraded resist 33 remains within some residue portions 31a. For this reason, it was found that this method of $O_2+N_2$ downstream ashing only is impractical. It is assumed that the residue (degraded resist) 31, the residue portions (degraded resist) 31a and the non-degraded resist 33 adhere on the surface of the wafer 16 as shown in FIG. 6.

Accordingly, when removing the resist, the residue remains on the wafer surface when the $O_2$ RIE is used. No residue remains on the wafer surface when the $H_2$ RIE or the $H_2O$ RIE is used. In addition, no residue remains on the wafer surface when the $H_2$ RIE or the $H_2O$ RIE and the ($O_2+N_2$) downstream ashing are used. But when the $O_2$ RIE and the ($O_2+N_2$) downstream ashing are used, rough portions are formed on the wafer surface. When the $H_2$ RIE and the $H_2O$ RIE are compared, the ashing time required in the case of the $H_2O$ RIE is approximately ¼or less than the ashing time required in the case of the $H_2$ RIE. Furthermore, with respect to the non-degraded resist, the ashing rate of the $H_2O$ RIE is several times faster than that of the $H_2$ RIE. Therefore, it was confirmed that the $H_2O$ RIE is a practical method of removing the resist.

A Japanese Laid-Open Patent Application No. 63-216346 proposes a method of removing a layer of an organic matter by adding $O_2$ to introduce a gas which is added with $H_2O$ into the electron cycrotron resonance (ECR) plasma and decomposing the gas within the ECR plasma. But in the embodiments of the present invention, the energy source for generating the plasma is a high-frequency (RF) energy source and the ECR plasma is not used. In addition, the embodiments use only the $H_2O$ plasma and does not use the $O_2+H_2O$ plasma.

In the described embodiment, the $(O_2+N_2)$ downstream ashing is used. However, it is possible to use a $(O_2+H_2O)$ downstream ashing in place of the $(O_2+N_2)$ downstream ashing. In this case, it is possible to reduce the degradation of the resist caused by Na.

Further, the present invention is not limited to these embodiments, but various variations and modifications may be made without departing from the scope of the present invention.

What is claimed is:

1. A method of removing a first layer of an organic matter which is formed on a second layer, said first layer being subjected to an ion implantation, said method comprising the steps of:
   generating a plasma by exciting a gas which includes $H_2O$ using a high-frequency energy source; and
   removing the first layer within said plasma.

2. The method as claimed in claim 1 wherein said step of removing the first layer removes a first portion of the first layer, and said method further comprises the step of removing a remaining portion of the first layer by a downstream ashing using $O_2$.

3. The method as claimed in claim 2 wherein the first portion of the first layer is degraded by the ion implantation and the remaining portion of the first layer is virtually unaffected by the ion implantation.

4. The method as claimed in claim 3 wherein the first layer is made of a resist.

5. The method as claimed in claim 4 wherein the step of removing the remaining portion uses a downstream ashing using $O_2+N_2$.

6. The method as claimed in claim 4 wherein the step of removing the remaining portion uses a downstream ashing using $O_2+H_2O$.

7. The method as claimed in claim 1 wherein said step of removing the first layer removes a first portion of the first layer, and said method further comprises the step of removing a remaining portion of the first layer by a wet etching.

8. The method as claimed in claim 7 wherein the first portion of the first layer is degraded by the ion implantation and the remaining portion of the first layer is virtually unaffected by the ion implantation.

9. The method as claimed in claim 1 wherein said step of generating the plasma uses a parallel plate type reactive ion etching apparatus to excite the gas which includes $H_2O$.

10. The method as claimed in claim 1 wherein said step of removing the first layer removes a first portion of the first layer, and said method further comprises the step of removing a remaining portion of the first layer by a downstream ashing using a gas mixture which includes one of $O_2$, $H_2O$ and $N_2$.

11. The method as claimed in claim 1 wherein the first layer is subjected to an ion implantation at a dosage of at least $1\times10^{14}$ atoms/cm$^2$.

* * * * *